(12) United States Patent
Majhi et al.

(10) Patent No.: US 11,342,457 B2
(45) Date of Patent: May 24, 2022

(54) STRAINED THIN FILM TRANSISTORS

(71) Applicant: Intel Corporation, Santa Clara, CA (US)

(72) Inventors: Prashant Majhi, San Jose, CA (US); Willy Rachmady, Beaverton, OR (US); Brian S. Doyle, Portland, OR (US); Abhishek A. Sharma, Hillsboro, OR (US); Elijah V. Karpov, Portland, OR (US); Ravi Pillarisetty, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/633,094

(22) PCT Filed: Sep. 18, 2017

(86) PCT No.: PCT/US2017/052107
§ 371 (c)(1),
(2) Date: Jan. 22, 2020

(87) PCT Pub. No.: WO2019/055051
PCT Pub. Date: Mar. 21, 2019

(65) Prior Publication Data
US 2020/0161473 A1    May 21, 2020

(51) Int. Cl.
*H01L 29/78* (2006.01)
*H01L 29/66* (2006.01)
*H01L 29/786* (2006.01)

(52) U.S. Cl.
CPC .... *H01L 29/7849* (2013.01); *H01L 29/66977* (2013.01); *H01L 29/7853* (2013.01);
(Continued)

(58) Field of Classification Search
CPC .......... H01L 29/7849; H01L 29/66977; H01L 29/7853; H01L 29/78606; H01L 29/78675;
(Continued)

(56) References Cited

U.S. PATENT DOCUMENTS

2003/0057416 A1* 3/2003 Currie ............... H01L 29/36
257/19
2004/0065927 A1  4/2004 Bhattacharyya
(Continued)

FOREIGN PATENT DOCUMENTS

| JP | 2001060691 | 3/2001 |
| JP | 2003203925 | 7/2003 |
| WO | WO-2010-086154 | 8/2010 |

OTHER PUBLICATIONS

International Search Report and Written Opinion for International Patent Application No. PCT/US2017/052107 dated Jun. 18, 2018, 10 pgs.
(Continued)

*Primary Examiner* — Mohammed R Alam
(74) *Attorney, Agent, or Firm* — Schwabe, Williamson & Wyatt, P.C.

(57) ABSTRACT

Strained thin film transistors are described. In an example, an integrated circuit structure includes a strain inducing layer on an insulator layer above a substrate. A polycrystalline channel material layer is on the strain inducing layer. A gate dielectric layer is on a first portion of the polycrystalline channel material. A gate electrode is on the gate dielectric layer, the gate electrode having a first side opposite a second side. A first conductive contact is adjacent the first side of the gate electrode, the first conductive contact on a second portion of the polycrystalline channel material. A second conductive contact adjacent the second side of the gate
(Continued)

electrode, the second conductive contact on a third portion of the polycrystalline channel material.

24 Claims, 9 Drawing Sheets

(52) U.S. Cl.
CPC .... *H01L 29/78606* (2013.01); *H01L 29/7869* (2013.01); *H01L 29/78675* (2013.01); *H01L 29/78678* (2013.01); *H01L 29/78681* (2013.01)

(58) Field of Classification Search
CPC ......... H01L 29/78678; H01L 29/78681; H01L 29/7869; H01L 29/78696; H01L 29/41733; H01L 29/78
See application file for complete search history.

(56) References Cited

U.S. PATENT DOCUMENTS

| | | | |
|---|---|---|---|
| 2007/0238320 A1* | 10/2007 | Bhattacharyya | .... H01L 21/3145 438/786 |
| 2008/0145979 A1 | 6/2008 | Huang | |
| 2008/0185667 A1 | 8/2008 | Yoshino | |
| 2009/0017640 A1* | 1/2009 | Huh | ................. H01L 21/76814 438/783 |
| 2009/0173967 A1 | 7/2009 | Hamaguchi | |
| 2010/0264510 A1* | 10/2010 | Ohtsuki | .................. H01L 29/32 257/506 |
| 2011/0127522 A1* | 6/2011 | Yamazaki | ......... H01L 21/02565 257/43 |
| 2011/0127590 A1 | 6/2011 | Binder et al. | |
| 2013/0075826 A1 | 3/2013 | Xu | |
| 2013/0175530 A1 | 7/2013 | Noda | |
| 2014/0206166 A1 | 7/2014 | Liu et al. | |
| 2016/0225913 A1* | 8/2016 | Fujioka | .................. H01L 29/04 |
| 2017/0125408 A1 | 5/2017 | Park et al. | |

OTHER PUBLICATIONS

International Preliminary Report on Patentability for International Patent Application No. PCT/US2017/052107, dated Apr. 2, 2020, 7 pgs.
Search Report for European Patent Application No. 17925227.5, dated Mar. 19, 2021, 9 pgs.
Park Jae Hyo et al: 11 Compressive Stressed 1-14 P-Channel Polycrystalline-Silicon Thin-Film Transistors for High Field-Effect Mobility 11, IEEE Electron Device Letters, IEEE, USA, vol. 36, No. 8, Aug. 1, 2015 (Aug. 1, 2018), pp. 793-795, XP011663951, ISSN: 0741-3106, DOI: 10.1109/LED.2015.2443153 [retrieved on Jul. 22, 2015].
Huang C-F et al: "Mechanical strain 1-14 effect of n-channel polycrystalline silicon thin-film transistors", Applied Physics Letters, A I P Publishing LLC, US, vol. 89, No. 10, Sep. 5, 2006 (Sep. 5, 2009), pp. 103502-103502, XP012085612, ISSN: 0003-6951, DOI: 10.1063/1.2344855.

\* cited by examiner

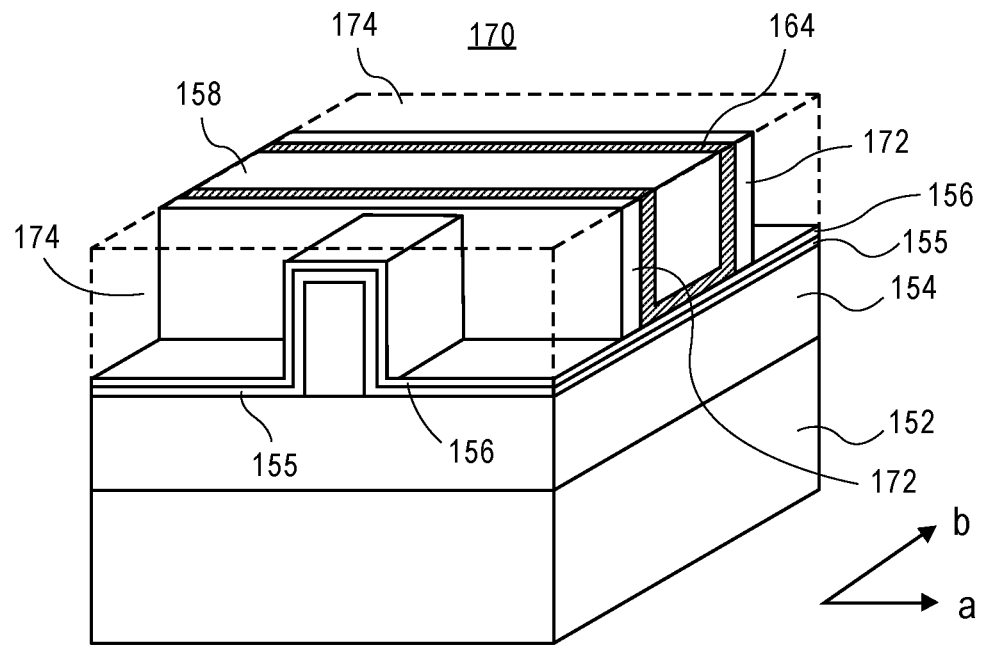
FIG. 1C
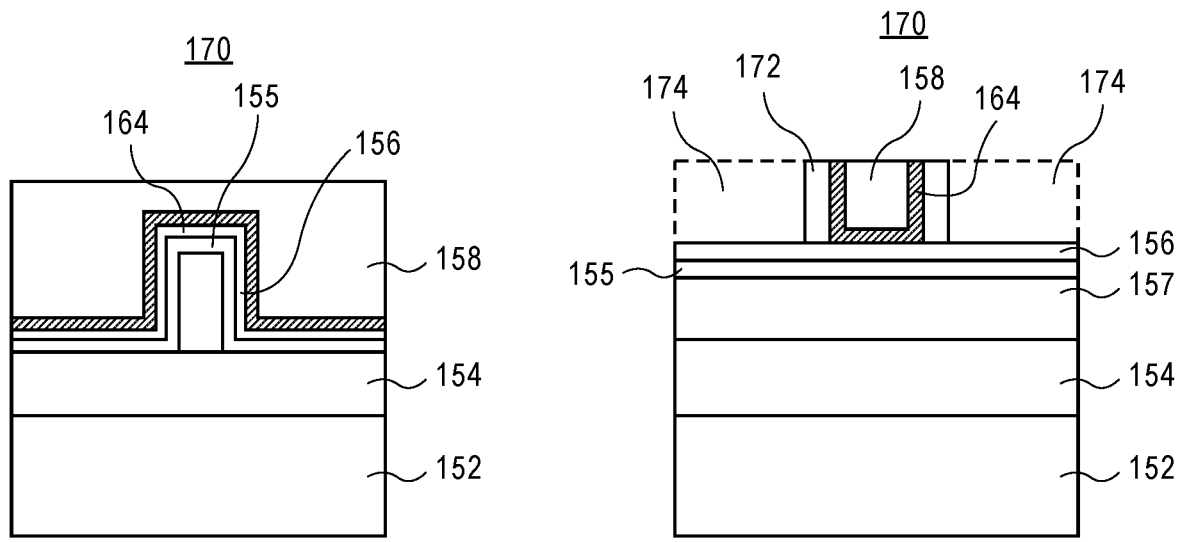
FIG. 1D    FIG. 1E

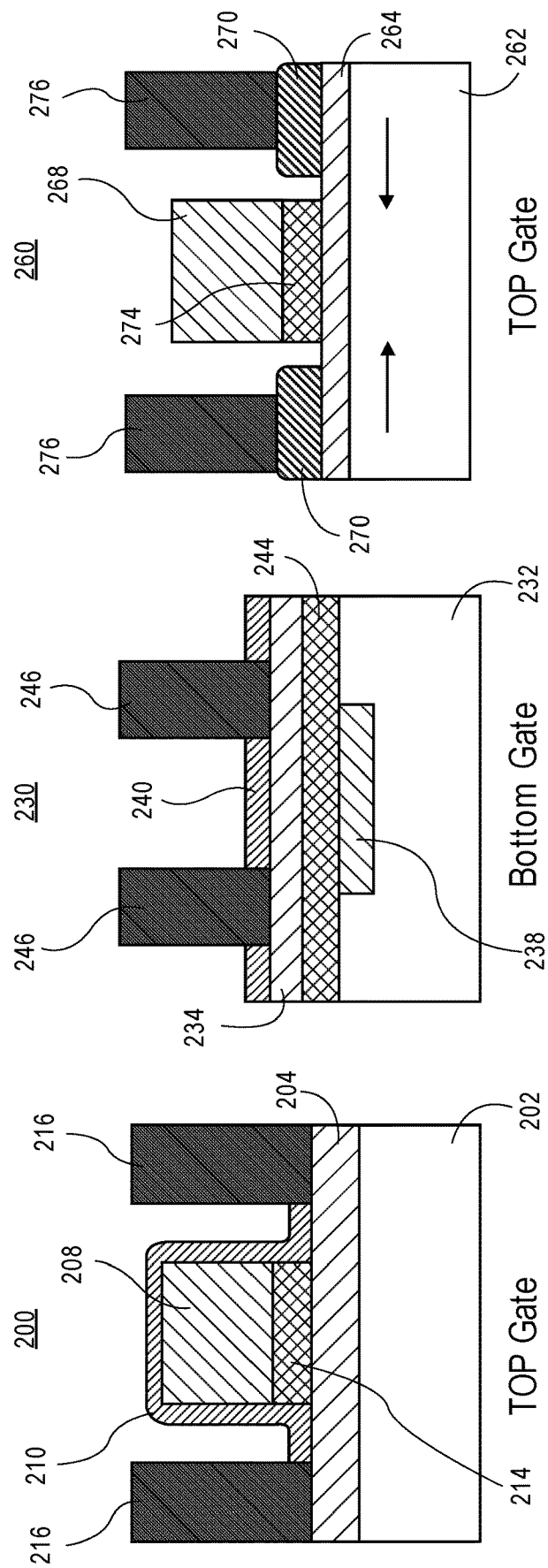

STRAINED THIN FILM TRANSISTORS

CROSS-REFERENCE TO RELATED APPLICATION

This patent application is a U.S. National Phase Application under 35 U.S.C. § 371 of International Application No. PCT/US2017/052107, filed Sep. 18, 2017, entitled "STRAINED THIN FILM TRANSISTORS," which designates the United States of America, the entire disclosure of which is hereby incorporated by reference in its entirety and for all purposes.

TECHNICAL FIELD

Embodiments of the disclosure are in the field of integrated circuit structures and, in particular, strained thin film transistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 1C, 1D, and 1E illustrate angled and direct cross-sectional views of a strained thin film integrated circuit structure, in accordance with an embodiment of the present disclosure.

FIG. 2A illustrates a cross-sectional view of a strained top gate thin film integrated circuit structure, in accordance with another embodiment of the present disclosure.

FIG. 2B illustrates a cross-sectional view of a strained bottom gate thin film integrated circuit structure, in accordance with another embodiment of the present disclosure.

FIG. 2C illustrates a cross-sectional view of another strained top gate thin film integrated circuit structure, in accordance with another embodiment of the present disclosure.

DESCRIPTION OF THE EMBODIMENTS

Figure 1A:
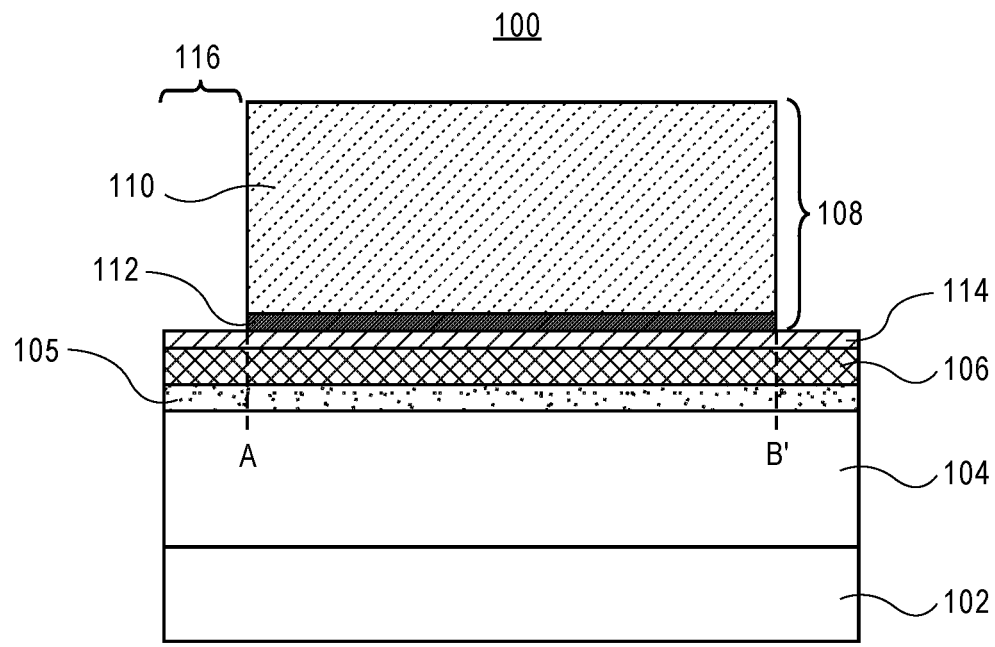
FIG. 1A illustrates a cross-sectional view taken along a gate "width" of a strained planar thin film integrated circuit structure, in accordance with an embodiment of the present disclosure.

Strained thin film transistors are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating BEOL thin film transistors (TFTs) having a strain inducing material layer. Embodiments may include or pertain to one or more of back end transistors, thin film transistors, and system-on-chip (SoC) technologies. One or more embodiments may be implemented to realize high performance backend transistors to potentially increase monolithic integration of backend logic plus memory in SoCs of future technology nodes.

To provide context, there is increased need for advanced SoCs to include monolithically integrated BEOL transistors for logic functionality at higher metal layers. For dense logic and embedded memory (e.g., 1T1R, 1T1C, 2T1C, etc.) built on backend levels, transistors having low voltage and high drive strength may be most suitable. However, current state-of-art transistors (both top gate and bottom gate) have significant challenges in demonstrating high drive strength due to low mobility. One significant challenge is that attempts to provide low temperature (e.g., compatible to backend processing) polysilicon channel MOSFETs typically has led to low mobility devices, especially for scenarios where a channel is relatively thin for the sake of controlling variability.

In accordance with embodiments of the present disclosure, backend compatible TFTs having process induced strain are described. Such strained TFTs can exhibit improved drive strength relative to conventional TFTs. Advantages of integrated circuit structures described herein may include an increased mobility/performance by local strain, reduced Ioff, backend compatibility, and scalability. Strain may be provided for TFTs described herein with the implementation of a strain inducing layer (e.g., SiON, BC) or by the inclusion of strain-inducing epitaxial source or drain regions (e-S/Ds).

In particular embodiments, the drive strength of a transistor is improved by increasing the mobility of the electrons (nFET) and holes (pFET) by straining the channel. As exemplifying embodiments, disclosed herein are specific device structures implementing significant strain (e.g., process induced) locally around a channel area of a TFT. Several exemplary and illustrative embodiments for strained TFTs are described below. It is to be appreciated that in addition to planar device architectures, strained TFTs can also be realized in non-planar TFT structures to not only increase the effective width, but also the mobility, hence realizing high performance TFTs in backend compatible processes.

As an exemplary planar architecture, FIG. 1A illustrates a cross-sectional view taken along a gate "width" of strained planar thin film integrated circuit structure, in accordance with an embodiment of the present disclosure.

Referring to FIG. 1A, a planar TFT 100 is formed above a substrate 102, e.g., on an insulating layer 104 above a substrate, as is shown. The planar TFT 100 includes a channel material layer 106, such as a polycrystalline channel material layer. The channel material layer 106 is on a strain inducing layer 105. A gate electrode 108 is formed on a gate dielectric layer 114 formed on the channel material layer 106. The gate electrode 108 may include a fill material 110 on a workfunction layer 112, as is depicted. The gate electrode 108 may expose regions 116 of the channel material layer 106 and the gate dielectric layer 114, as is depicted. Alternatively, the channel material layer 106 and the gate dielectric layer 114 have a same lateral dimension as the gate electrode 108. It is to be appreciated that source/drain regions are into and out of the page of the view of FIG. 1A.

The planar TFT 100 has an effective gate width that is the length of the planar channel material 106 between locations A and B, as depicted in FIG. 1A. The TFT 100 may be referred to herein as a planar BEOL field effect transistor (FET). In accordance with other embodiments described herein, non-planar BEOL-compatible thin film transistors (TFTs) are fabricated by effectively increasing the transistor width (and hence the drive strength and performance) for a given projected area. A TFT fabricated using such an architecture may exhibit an increase in gate control, stability, and performance of thin film transistors. Applications of such systems may include, but are not limited to, back end (BEOL) logic, memory, or analog applications. Embodiments described herein may include non-planar structures that effectively increase transistor width (relative to a planar device) by integrating the devices in unique architectures.

Figure 1B:
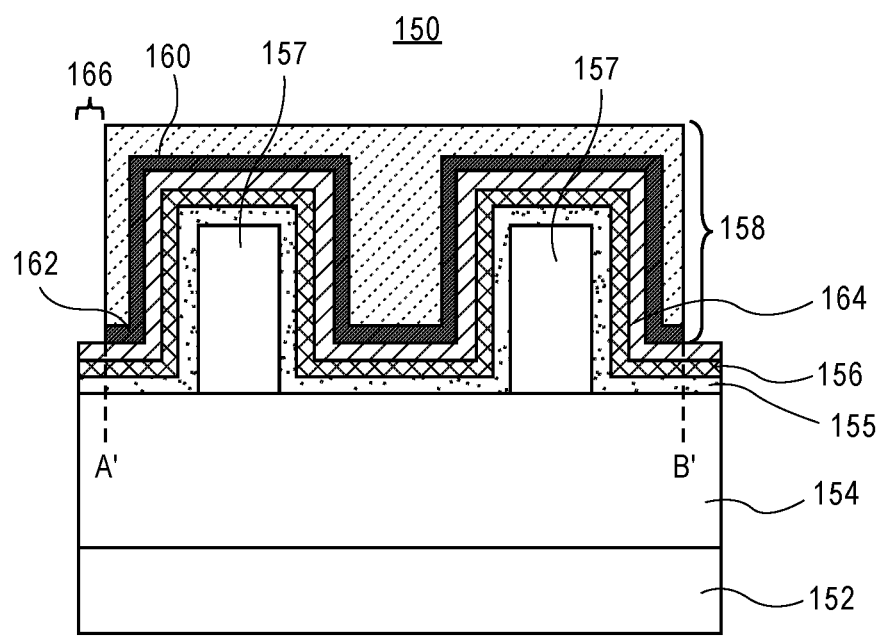
FIG. 1B illustrates a cross-sectional view taken along a gate "width" of a strained non-planar thin film integrated circuit structure, in accordance with an embodiment of the present disclosure.

As a first example of a structure having relative increase in transistor width (e.g., relative to the structure of FIG. 1A), FIG. 1B illustrates a cross-sectional view taken along a gate "width" of a strained non-planar thin film integrated circuit structure, in accordance with an embodiment of the present disclosure.

Referring to FIG. 1B, a non-planar TFT 150 is formed above a substrate 152, e.g., on an insulating layer 154 above a substrate, as is shown. A pair of dielectric fins 157 is on the insulating layer 154. The non-planar TFT 150 includes a channel material layer 156, such as a polycrystalline channel material layer. The channel material layer 156 is on a strain inducing layer 155. The channel material layer 156 and the strain inducing layer 155 are conformal with the pair of dielectric fins 157 and with exposed portions of the insulating layer 154 between the pair of dielectric fins 157. A gate electrode 158 is formed on a gate dielectric layer 164 formed on the channel material layer 156. The gate electrode 158 may include a fill material 160 on a workfunction layer 162, as is depicted. The gate electrode 158 may expose regions 166 of the channel material layer 156 and the gate dielectric layer 164, as is depicted. Alternatively, the channel material layer 156 and the gate dielectric layer 164 have a same lateral dimension as the gate electrode 158. It is to be appreciated that source/drain regions are into and out of the page of the view of FIG. 1B.

The non-planar TFT 150 has an effective gate width that is the length of the channel material layer 156 between locations A' and B', i.e., the full length including undulating portions over the tops and sidewalls of the dielectric fins 157, as is depicted in FIG. 1B. The TFT 150 may be referred to herein as a non-planar BEOL field effect transistor (FET). In comparison to FIG. 1A, the structure of FIG. 1B highlights the advantage of a non-planar architecture to increase effective gate width, referred to herein as a relatively increased width.

Referring collectively to FIGS. 1A and 1B, and as is applicable to embodiments described throughout the present disclosure, in an embodiment, the strain inducing layer 105 or 155 is composed of or includes a boron carbide (BC) material layer. In another embodiment, the strain inducing layer 105 or 155 is composed of or includes a silicon oxynitride (SiON) material layer.

Referring collectively to FIGS. 1A and 1B, and as is applicable to embodiments described throughout the present disclosure, in an embodiment, the channel material layer 106 or 156 is composed of or includes a polycrystalline silicon layer. In one such embodiment, the gate dielectric layer 114 or 164 includes a layer of a high-k dielectric material directly on a silicon oxide layer on the polycrystalline silicon layer. In another embodiment, the channel material layer 106 or 156 is composed of or includes a polycrystalline germanium material layer or a polycrystalline silicon germanium material layer.

In another embodiment, the channel material layer 106 or 156 is composed of or includes a polycrystalline group III-V material layer. In a specific embodiment, the gate dielectric layer 114 or 164 includes a layer of a high-k dielectric material directly on the group III-V material layer.

In an alternative embodiment, the channel material layer 106 or 156 is composed of or includes is a semiconducting oxide material layer. In one such embodiment, the semiconducting oxide material layer includes a material selected from the group consisting of indium gallium zinc oxide (IGZO), tin oxide, antimony oxide, indium oxide, indium tin oxide, titanium oxide, zinc oxide, indium zinc oxide, gallium oxide, titanium oxynitride, ruthenium oxide and tungsten oxide. In a specific embodiment, the gate dielectric layer 114 or 164 includes a layer of a high-k dielectric material directly on the semiconducting oxide material.

To highlight other aspects of a non-planar TFT topography, FIGS. 1C, 1D, and 1E illustrate angled and direct cross-sectional views of a strained thin film integrated circuit structure, in accordance with an embodiment of the present disclosure. It is to be appreciated that one dielectric fin is illustrated in FIGS. 1C-1E for simplification. Embodiments may include a single device fabricated over one (FIG. 1C), two (FIG. 1B) or more such dielectric fins.

Referring to FIGS. 1C-1E, an integrated circuit structure 170 includes a dielectric fin 157 on an insulator layer 154 above a substrate 152. The dielectric fin 157 has a top and sidewalls. A channel material layer 156 is on a strain inducing layer 155 on the top and sidewalls of the dielectric fin 157. A gate electrode 158 is over a first portion of the channel material layer 156. The gate electrode 158 has a first side opposite a second side. A first conductive contact (left 174) is adjacent the first side of the gate electrode 158, over a second portion of the channel material layer 156. A second conductive contact (right 174) is adjacent the second side of the gate electrode 158, over a third portion of the channel material layer 156.

In an embodiment, the integrated circuit structure 170 further includes a gate dielectric layer 164 between the gate electrode 158 and the first portion of the channel material layer 156, as is depicted in FIGS. 1C-1E. In an embodiment, the integrated circuit structure 170 further includes a first dielectric spacer (left 172) between the first conductive contact 174 and the first side of the gate electrode 158, the first dielectric spacer 172 over a fourth portion of the channel material layer 156. A second dielectric spacer (right 172) is between the second conductive contact 174 and the second side of the gate electrode 158, the second dielectric spacer 172 over a fifth portion of the channel material layer 156, as is depicted in FIGS. 1C and 1E. In one such embodiment, the gate dielectric layer 164 is further along the first and second dielectric spacers 172, as is also depicted in FIGS. 1C and 1E.

Referring collectively to FIGS. 1B-1E, in accordance with an embodiment of the present disclosure, an integrated circuit structure 150 or 170 includes an insulator structure 157 above a substrate 152. The insulator structure 157 has a topography that varies along a plane (ab) parallel with a global plane of the substrate 152. A channel material layer 156 is on a strain inducing layer 155 on the insulator structure 157. The channel material layer 156 and the strain inducing layer 155 are conformal with the topography of the insulator structure 157. A gate electrode 158 is over a first portion of the channel material layer 156. The gate electrode 158 has a first side opposite a second side. A first conductive contact (left 174) is adjacent the first side of the gate electrode 158. The first conductive contact 174 is over a second portion of the channel material layer 156. A second conductive contact (right 174) is adjacent the second side of the gate electrode 158. The second conductive contact 174 is over a third portion of the channel material layer 156.

In an embodiment, the insulator structure 150 or 170 includes one or more fins 157. Individual ones of the fins 157 have a top and sidewalls. The channel material layer 156 is on the strain inducing layer 155 the top and sidewalls of the individual ones of the fins 157. In an embodiment, the insulator structure 157 (such as fin or fins 157) is composed of a dielectric material such as, but not limited to, silicon dioxide, silicon oxy-nitride, silicon nitride, or carbon-doped silicon nitride. In an embodiment, the insulator structure 157 is composed of a low-k dielectric material.

In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 157 each have squared-off (as shown) or rounder corners.

In an embodiment, a gate dielectric layer 164 is between the gate electrode 158 and the first portion of the channel material layer 156, as is depicted. In one such embodiment, the gate dielectric layer 164 includes a layer of a high-k dielectric material above or directly on the channel material layer 156.

In an embodiment, a first dielectric spacer (first 172) is between the first conductive contact (first 174) and the first side of the gate electrode 158, the first dielectric spacer (first 172) over a fourth portion of the channel material layer 156. A second dielectric spacer (second 172) is between the second conductive contact (second 174) and the second side of the gate electrode 158, the second dielectric spacer (second 172) over a fifth portion of the channel material layer 156. In one such embodiment, a gate dielectric layer 164 is between the gate electrode 158 and the first portion of the channel material layer 156. The gate dielectric layer 164 is further along the first dielectric spacer (first 172) and the second dielectric spacer (second 172).

It is to be appreciated that a variety of architectural arrangements may benefit from including a strain inducing layer or feature. In an example of a top gate structure including a strain inducing layer, FIG. 2A illustrates a cross-sectional view of a strained top gate thin film integrated circuit structure, in accordance with another embodiment of the present disclosure.

Referring to FIG. 2A, a strained TFT 200 includes a channel material layer 204, such as a polycrystalline channel material layer, above a substrate 202. A gate electrode 208 is above the channel material layer 204. A strain inducing layer 210 is over the gate electrode 208, and may extend onto a portion of the channel material layer 204, as is depicted. A gate dielectric layer 214 may be included between the gate electrode 208 and the channel material layer 204, as is also depicted. Source or drain structures and/or source or drain contacts (shown generically as features 216) may be included on either side of the gate electrode 208.

In an example of a bottom gate structure including a strain inducing layer, FIG. 2B illustrates a cross-sectional view of a strained bottom gate thin film integrated circuit structure, in accordance with another embodiment of the present disclosure.

Referring to FIG. 2B, a strained TFT 230 includes a channel material layer 234, such as a polycrystalline channel material layer, above a substrate 232. A gate electrode 238 is below the channel material layer 234. A strain inducing layer 240 is on at least a portion of the channel material layer 234, as is depicted. A gate dielectric layer 244 may be included between the gate electrode 238 and the channel material layer 234, as is also depicted. Source or drain structures and/or source or drain contacts (shown generically as features 246) may be included at locations on the channel material layer 234.

In an example of a top gate structure including strain inducing source and drain features, FIG. 2C illustrates a cross-sectional view of another strained top gate thin film integrated circuit structure, in accordance with another embodiment of the present disclosure.

Referring to FIG. 2C, a strained TFT 260 includes a channel material layer 264, such as a polycrystalline channel material layer, above a substrate 262. A gate electrode 268 is above the channel material layer 264. Strain inducing epitaxial source or drain structures 270, such as lattice mis-matched epitaxial source or drain structures, are on either side of gate electrode 268. An exemplary strain direction is shown by the arrows in FIG. 2C. A gate dielectric layer 274 may be included between the gate electrode 268 and the channel material layer 264, as is also depicted. Source or drain contacts 276 may be included on the strain inducing epitaxial source or drain structures 270.

Figure 3A:
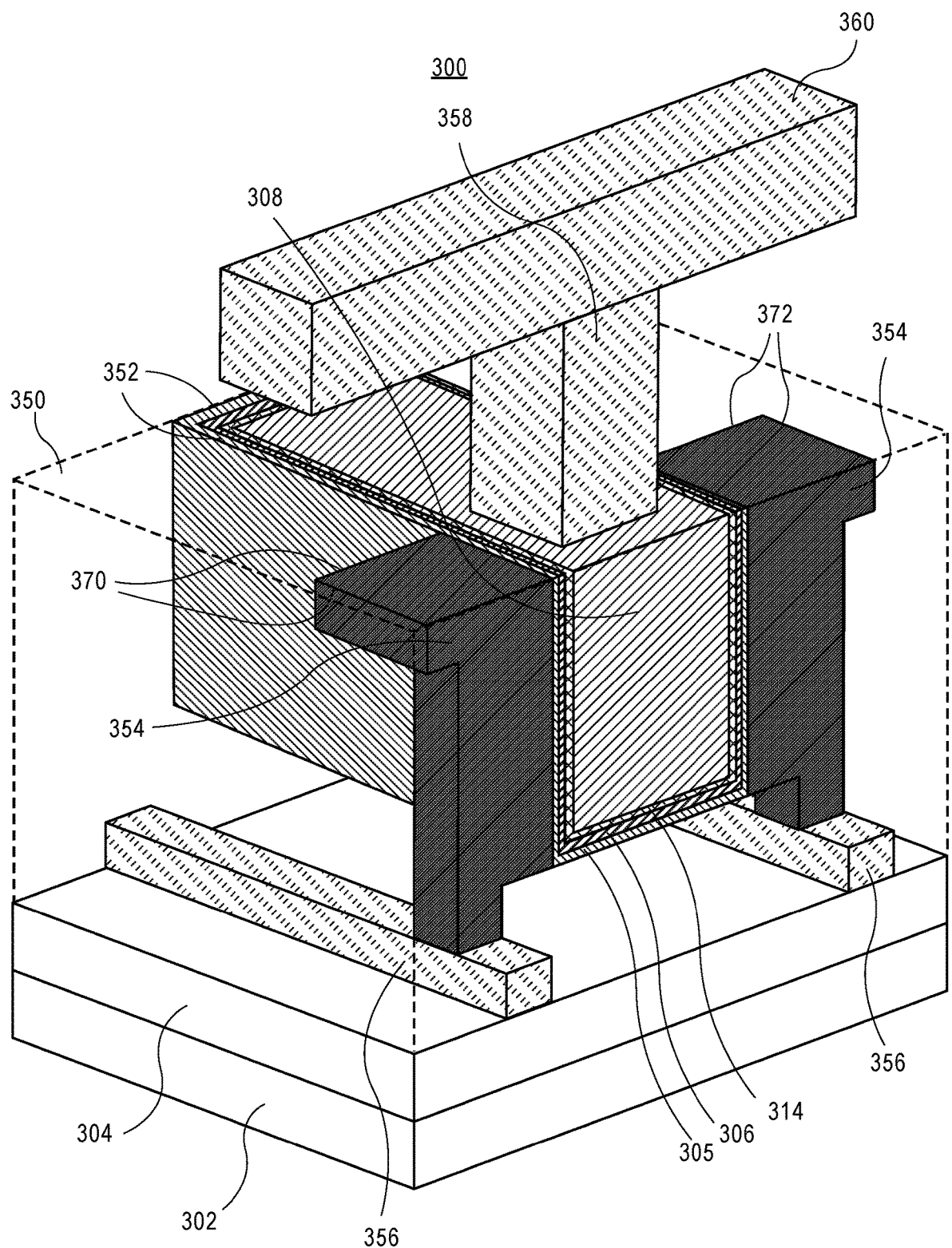
FIG. 3A illustrates an angled three-dimensional view of another strained thin film integrated circuit structure, in accordance with another embodiment of the present disclosure.
Figure 3B:
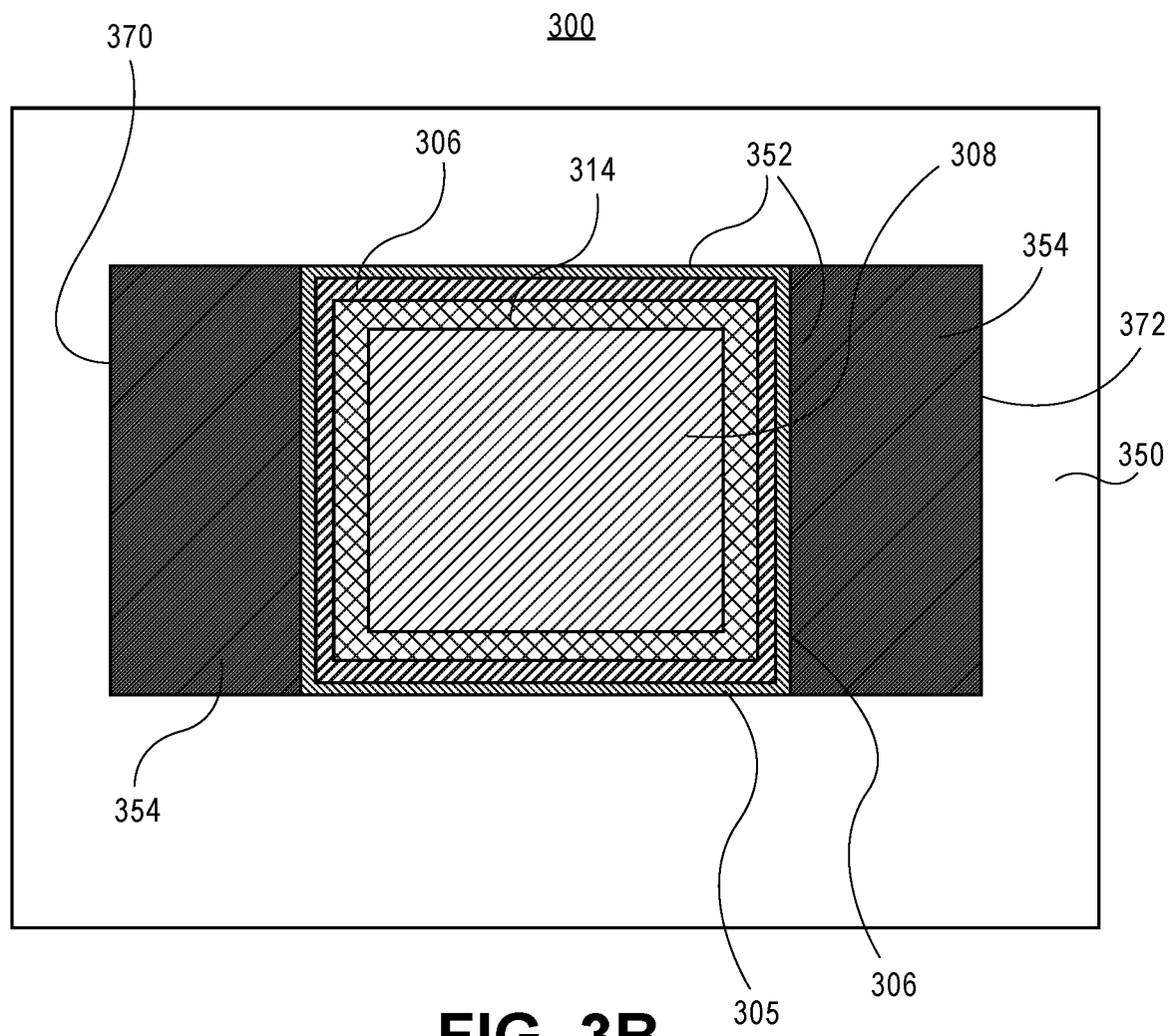
FIG. 3B illustrates a top-down view of a portion of the strained thin film integrated circuit structure of FIG. 3A, in accordance with an embodiment of the present disclosure.

As another example of a structure having relative increase in transistor width, FIG. 3A illustrates an angled three-dimensional view of another strained thin film integrated circuit structure, in accordance with another embodiment of the present disclosure. FIG. 3B illustrates a top-down view of a portion of the thin film integrated circuit structure of FIG. 3A.

Referring to FIGS. 3A and 3B, an integrated circuit structure 300 includes an insulator structure 350 above a substrate 302. The insulator structure 350 may be formed on an insulator layer 304, as is depicted. The insulator structure 350 has a first trench 352 therein, the first trench 352 having sidewalls and a bottom. A strain inducing layer 305 is in the first trench 352 in the insulator structure 350. A channel material layer 306 is on the strain inducing layer 305 is in the first trench 352 in the insulator structure 350. The channel material layer 306 is conformal with the sidewalls and bottom of the first trench 352. A gate dielectric layer 314 is on the channel material layer 306 in the first trench 352. The gate dielectric layer 314 is conformal with the channel material layer 306 conformal with the sidewalls and bottom of the first trench 352. A gate electrode 308 is on the gate dielectric layer 314 in the first trench 352. The gate electrode 308 has a first side opposite a second side and has an exposed top surface. A first conductive contact (left 354) is laterally adjacent the first side of the gate electrode 308. A second conductive contact (right 354) is laterally adjacent the second side of the gate electrode 308. It is to be appreciated that the conductive contacts 354 are shown only at the front portion of trench 352 for clarity of the drawing. In an embodiment, the conductive contacts 354 extend all the way, or substantially all the way along the trench 352 for maximized source/drain contact area and maintain a relatively small effective gate length.

In an embodiment, the insulator structure 350 is a single layer of ILD material, as is depicted. In another embodiment, the insulator structure 350 is a stack of alternating dielectric layers, such as described in association with FIGS. 4A-4C.

In an embodiment, a third conductive contact 358 is over and in contact with the exposed top surface of the gate electrode 308, as is depicted. In an embodiment, the first conductive contact (left 354) is in a second trench 370 in the insulator structure 350, and the third conductive contact (right 354) is in a third trench 372 in the insulator structure 350, as is depicted. In an embodiment, the third conductive contact 358 is coupled to a conductive line 360, which may be a word line, as is depicted. In an embodiment, the first and second conductive contacts 354 are coupled corresponding conductive lines 356, as is depicted.

Referring again to FIG. 3A, in an embodiment, a non-planar back-end FET architecture uses the vertical length (depth) of the trench 352 to increase effective width of the transistor. That is, the depth of the trench 352 is the Z of the TFT, where the effective width (Weff) is relatively increased by setting Z to the depth of the trench.

In accordance with an embodiment of the present disclosure, the above TFT non-planar architectures 150, 170, and 300 provide for higher effective widths for a transistor for a scaled projected area. In an embodiment, the drive strength and performance of such transistors are improved over state-of-the-art planar BEOL transistors.

Figure 4A:
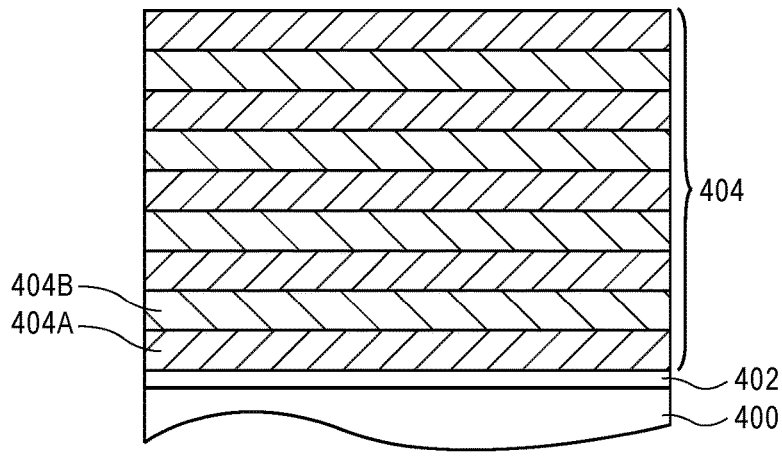
FIGS. 4A-4C illustrate cross-sectional and plan views of various stages in a method of fabricating a thin film integrated circuit structure, in accordance with an embodiment of the present disclosure.
Figure 4B:
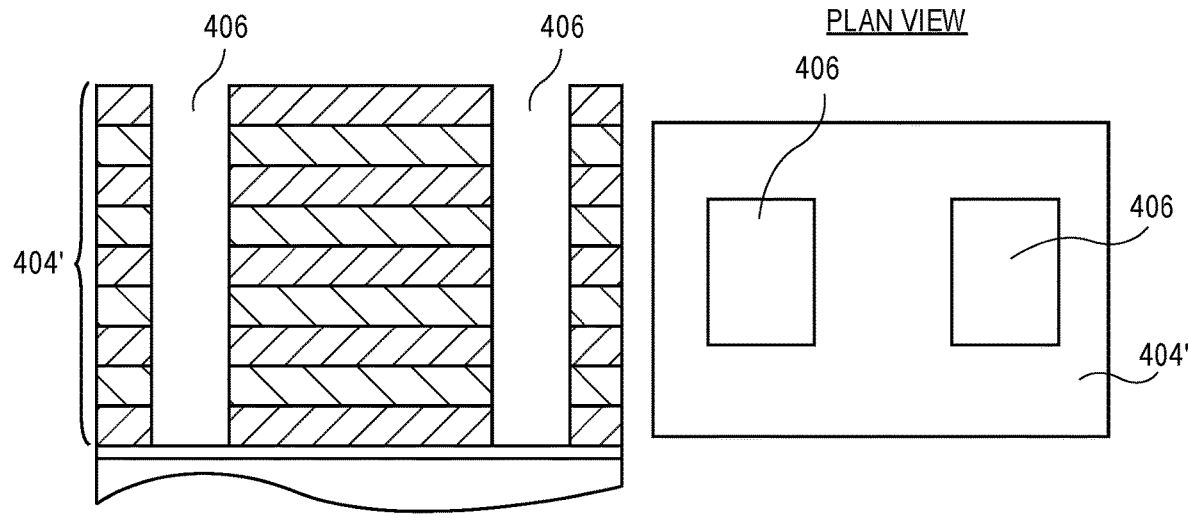
Figure 4C:
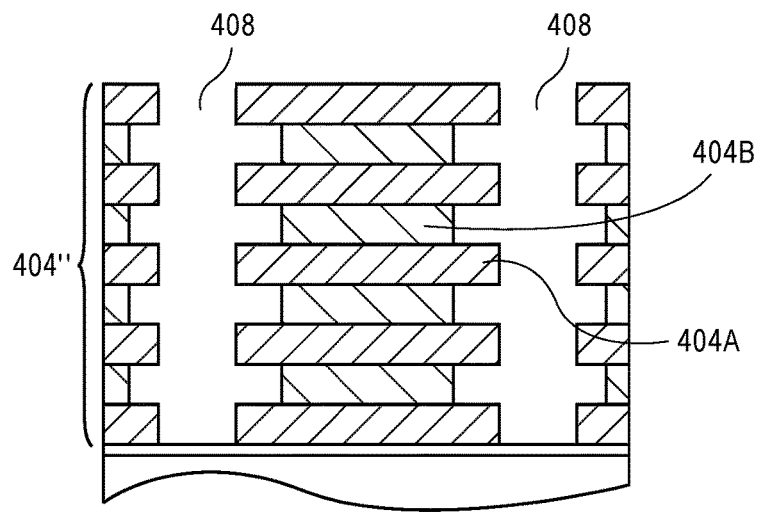

As an exemplary processing scheme, FIGS. 4A-4C illustrate cross-sectional and plan views of various stages in a method of fabricating a strained thin film integrated circuit structure, in accordance with an embodiment of the present disclosure.

Referring to FIG. 4A, a stack 404 of dielectric layers is formed above a substrate 400 and, possibly, on an insulating layer 402 formed on or above the substrate 400. The stack 404 of dielectric layers includes alternating dielectric layers 404A and 404B of differing composition. In one embodiment, the stack 404 of dielectric layers is a stack of alternating silicon dioxide and silicon nitride layers.

Referring to FIG. 4B, openings 406 are formed in the stack 404 of dielectric layers to form a once-patterned stack 404' of dielectric layers. In one embodiment, the structure of FIG. 4B is used without the process described below in association with FIG. 4C in order to arrive at a structure such as TFT 300.

Referring to FIG. 4C, corrugation is achieved to form corrugated openings 408 by exposing the structure of FIG. 4B to an etch process that recesses layers 404B selective to layers 404A. The selective etching process provides twice-patterned stack 404" of dielectric layers.

The twice-patterned stack 404" of dielectric layers may be used in order to fabricate a tunnel FET having a corrugated topography. In one such embodiment, the corrugated topography varies along a plane normal with a global plane of the substrate 402, as is depicted. A tunnel FET may be fabricated in the trench of FIG. 4C to provide a structure similar to that of tunnel FET 300 which increases Z using the vertical length (depth) of the trench, but with the additional feature of additional length (Z) provided by the corrugation, to further increase effective width of the transistor. That is, the length of the corrugated trench is the Z of the ultimately fabricated tunnel FET, where the effective width (Weff) is relatively increased by setting Z to the depth or length along the corrugated trench.

It is to be appreciated that the layers and materials described in association with embodiments herein are typically formed on or above an underlying semiconductor substrate 152, 202, 232, 262, 302 or 400, e.g., as FEOL layer(s). In other embodiments, the layers and materials described in association with embodiments herein are typically formed on or above underlying device layer(s) of an integrated circuit, e.g., as BEOL layer(s) above an underlying semiconductor substrate 152, 202, 232, 262, 302 or 400. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer 154, 304 or 402 is optionally used, the insulator layer 154, 304 or 402 may be composed of a material suitable to ultimately electrically isolate, or contribute to the isolation of, portions of a gate structure from an underlying bulk substrate or interconnect layer. For example, in one embodiment, the insulator layer 154, 304 or 402 is composed of a dielectric material such as, but not limited to, silicon dioxide, silicon oxy-nitride, silicon nitride, or carbon-doped silicon nitride. In a particular embodiment, the insulator layer 154, 304 or 402 is a low-k dielectric layer of an underlying BEOL layer.

In an embodiment, gate electrode 158, 208, 238, 268 or 308 includes at least one P-type work function metal or N-type work function metal, depending on whether the integrated circuit device 150, 170, 200, 230, 260 or 300 is to be included in a P-type transistor or an N-type transistor. For a P-type transistors, metals that may be used for the gate electrode 158, 208, 238, 268 or 308 may include, but are not limited to, ruthenium, palladium, platinum, cobalt, nickel, and conductive metal oxides (e.g., ruthenium oxide). For an N-type transistor, metals that may be used for the gate electrode 158, 208, 238, 268 or 308 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 158, 208, 238, 268 or 308 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layer 164, 214, 244, 274 or 314 is composed of a high-K material. For example, in one embodiment, the gate dielectric layer 164, 214, 244, 274 or 314 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric 164, 214, 244, 274 or 314 may consist of a "U"-shaped structure that includes a bottom portion substantially parallel to the surface of the substrate and two sidewall portions that are substantially perpendicular to the top surface of the substrate, as is depicted in FIGS. 1C and 1E.

In an embodiment, dielectric spacers 172 are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode 172.

In an embodiment, conductive contacts 174, 216, 246, 276, 354 or 358 act as contacts to source/drain regions of a TFT, or act directly as source/drain regions of the TFT. The conductive contacts 174, 216, 246, 276, 354 or 358 may be spaced apart by a distance that is the gate length of the transistor 150, 170, 200, 230, 260 or 300. In an embodiment, conductive contacts 358 directly contacts a gate electrode. In some embodiments, the gate length is between 7 and 30 nanometers. In an embodiment, the conductive contacts 174, 216, 246, 276, 354 or 358 include one or more layers of metal and/or metal alloys. In a particular embodiment, the conductive contacts 174, 216, 246, 276, 354 or 358 are composed of aluminum or an aluminum-containing alloy.

In an embodiment, interconnect lines (and, possibly, underlying via structures), such as interconnect lines 356 or 360, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein, such as ILD materials 350, are composed of or include a layer of a dielectric or insulating material. Examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer, e.g., gate electrode 158, 208, 238, 268 or 308 and gate dielectric layer 164, 214, 244, 274 or 314 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of SF6. In another embodiment, dummy gates are composed of polycrystalline silicon or amorphous silicon and are removed with a wet etch process including use of aqueous NH4OH or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, the integrated circuit structures described herein may be included in an electronic device. As a first example of an apparatus that may include one or more of the TFTs disclosed herein, FIGS. 5A and 5B are top views of a wafer and dies that include one or more strained thin film transistors, in accordance with any of the embodiments disclosed herein.

Figure 5B:
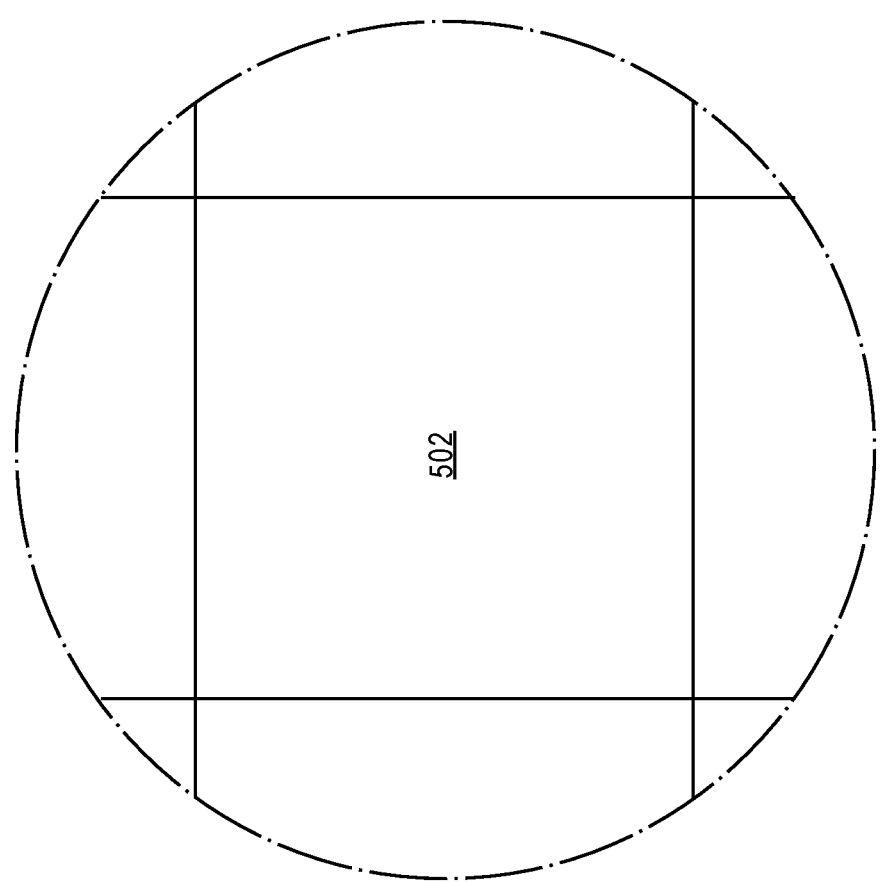
FIGS. 5A and 5B are top views of a wafer and dies that include one or more strained thin film transistors, in accordance with one or more of the embodiments disclosed herein.
Figure 5A:
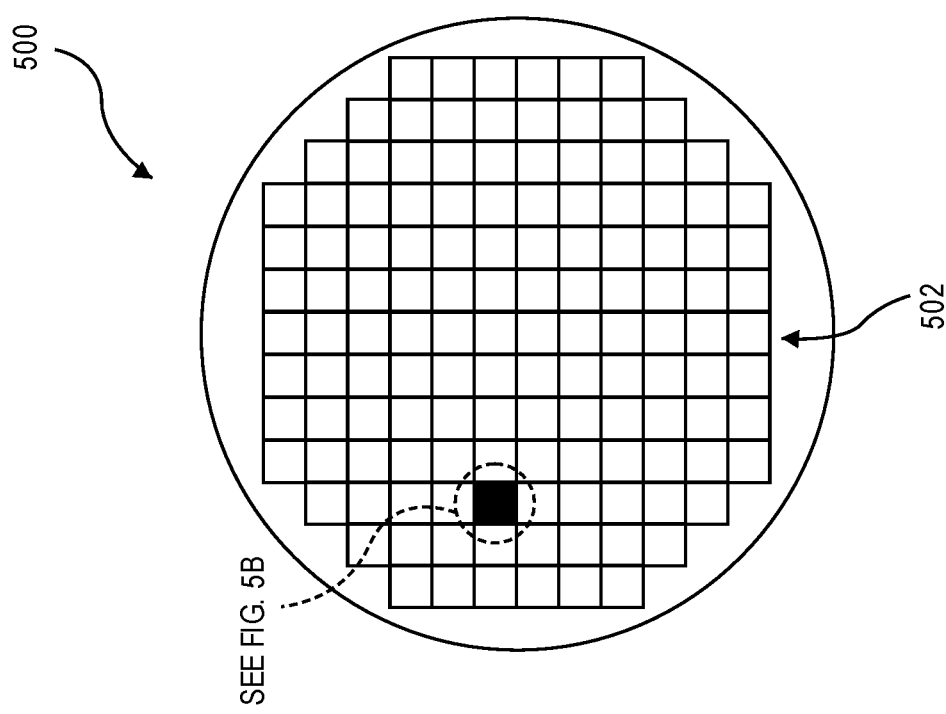

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more structures such as structures 150, 170, 200, 230, 260 or 300). After the fabrication of the semiconductor product is complete (e.g., after manufacture of structures 150, 170, 200, 230, 260 or 300), the wafer 500 may undergo a singulation process in which each of the dies 502 is separated from one another to provide discrete "chips" of the semiconductor product. In particular, devices that include strained TFTs as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 6:
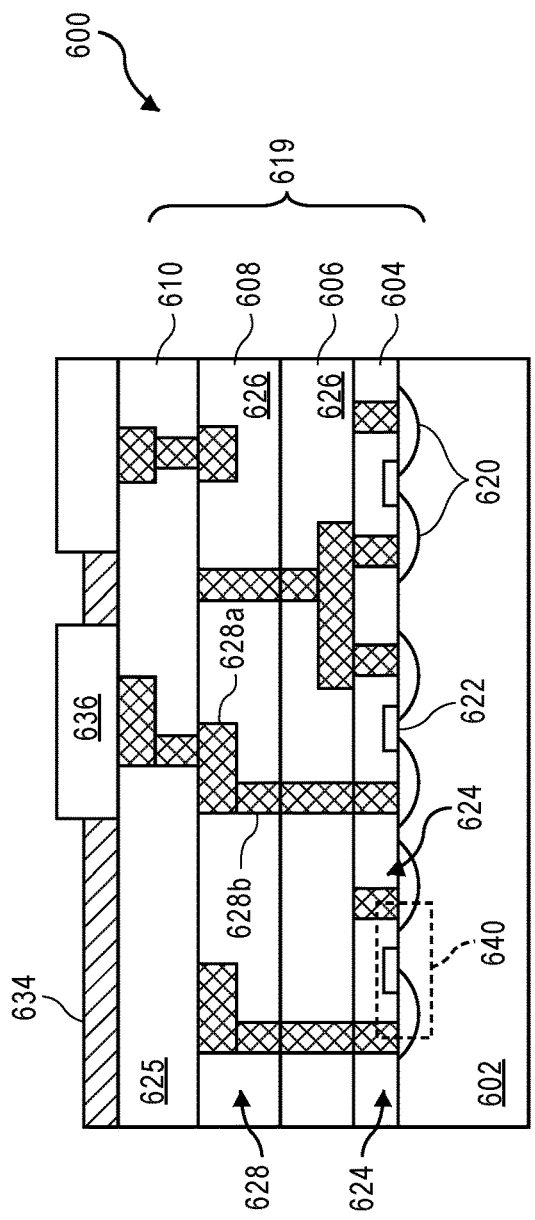
FIG. 6 is a cross-sectional side view of an integrated circuit (IC) device that may include one or more strained thin film transistors, in accordance with one or more of the embodiments disclosed herein.

FIG. 6 is a cross-sectional side view of an integrated circuit (IC) device that may include one or more strained thin film transistors, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described above in association with substrate 152, 202, 232, 262, 302 or 400, any material that may serve as a foundation for an IC device 600 may be used.

The IC device 600 may include one or more device layers, such as device layer 604, disposed on the substrate 602. The device layer 604 may include features of one or more transistors 640 (e.g., strained TFTs described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 640 take the form of the transistors 150, 170, 200, 230, 260 or 300. Strained thin-film transistors such as 150, 170, 200, 230, 260 or 300 may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610.

The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
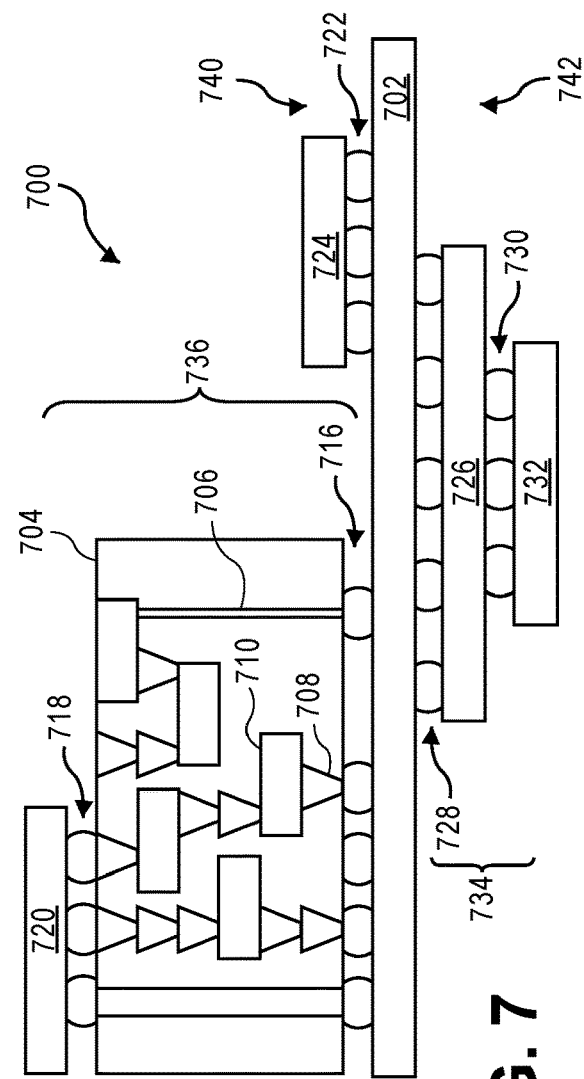
FIG. 7 is a cross-sectional side view of an integrated circuit (IC) device assembly that may include one or more strained thin film transistors, in accordance with one or more of the embodiments disclosed herein.

FIG. 7 is a cross-sectional side view of an integrated circuit (IC) device assembly that may include one or more strained thin film transistors, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the strained TFT structures 150, 170, 200, 230, 260 or 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
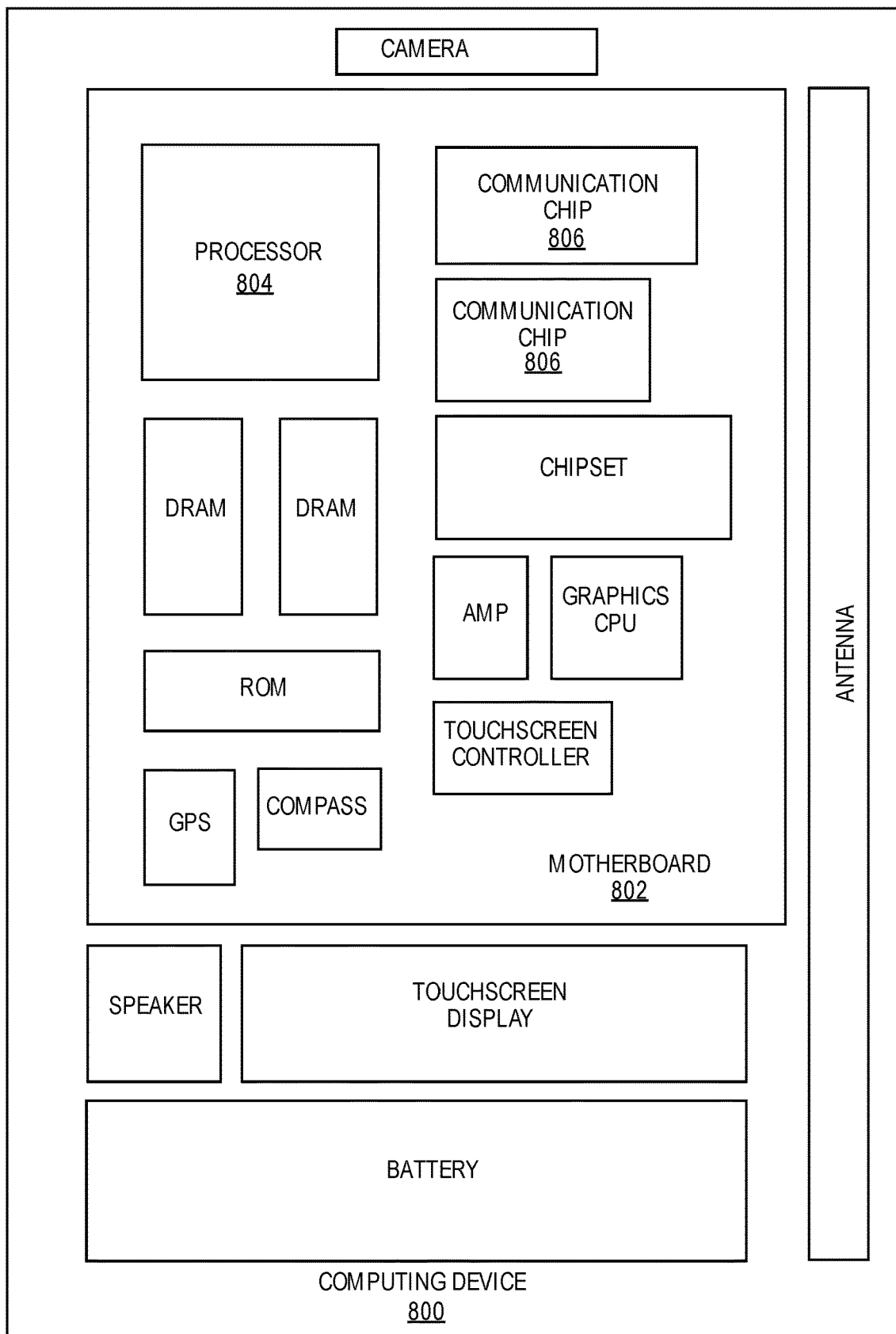
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more strained thin film transistors, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more strained thin film transistors, in accordance with implementations of embodiments of the disclosure.

In further implementations, another component housed within the computing device 800 may contain an integrated circuit die that includes one or more strained thin film transistors, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include strained thin film transistors.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a strain inducing layer on an insulator layer above a substrate. A polycrystalline channel material layer is on the strain inducing layer. A gate dielectric layer is on a first portion of the polycrystalline channel material. A gate electrode is on the gate dielectric layer, the gate electrode having a first side opposite a second side. A first conductive contact is adjacent the first side of the gate electrode, the first conductive contact on a second portion of the polycrystalline channel material. A second conductive contact adjacent the second side of the gate electrode, the second conductive contact on a third portion of the polycrystalline channel material.

Example embodiment 2: The integrated circuit structure of example embodiment 1, wherein the strain inducing layer includes a boron carbide (BC) material layer.

Example embodiment 3: The integrated circuit structure of example embodiment 1, wherein the strain inducing layer includes a silicon oxynitride (SiON) material layer.

Example embodiment 4: The integrated circuit structure of example embodiment 1, 2 or 3, wherein the polycrystalline channel material layer includes a polycrystalline silicon material layer.

Example embodiment 5: The integrated circuit structure of example embodiment 1, 2 or 3, wherein the polycrystalline channel material layer includes a polycrystalline Group III-V material layer.

Example embodiment 6: The integrated circuit structure of example embodiment 1, 2 or 3, wherein the polycrystalline channel material layer includes a semiconducting oxide material layer.

Example embodiment 7: The integrated circuit structure of example embodiment 1, 2, 3, 4, 5 or 6, wherein the gate dielectric layer includes a layer of a high-k dielectric material.

Example embodiment 8: An integrated circuit structure includes an insulator structure above a substrate, the insulator structure having a topography that varies along a plane parallel with a global plane of the substrate. A strain inducing layer is on the insulator structure, the strain inducing layer conformal with the topography of the insulator structure. A channel material layer is on the strain inducing layer, the channel material layer conformal with the topography of the insulator structure. A gate electrode is over a first portion of the channel material layer, the gate electrode having a first side opposite a second side. A first conductive contact is adjacent the first side of the gate electrode, the first conductive contact on a second portion of the channel material layer. A second conductive contact is adjacent the second side of the gate electrode, the second conductive contact on a third portion of the channel material layer.

Example embodiment 9: The integrated circuit structure of example embodiment 8, wherein the insulator structure includes one or more fins, individual ones of the fins having a top and sidewalls, the strain inducing layer on the top and sidewalls of the individual ones of the fins.

Example embodiment 10: The integrated circuit structure of example embodiment 8 or 9, further including a gate dielectric layer between the gate electrode and the first portion of the channel material layer.

Example embodiment 11: The integrated circuit structure of example embodiment 10, wherein the gate dielectric layer includes a layer of a high-k dielectric material.

Example embodiment 12: The integrated circuit structure of example embodiment 8, 9, 10 or 11, further including a first dielectric spacer between the first conductive contact and the first side of the gate electrode. A second dielectric spacer is between the second conductive contact and the second side of the gate electrode.

Example embodiment 13: The integrated circuit structure of example embodiment 8, 9, 10, 11 or 12, wherein the strain inducing layer includes a boron carbide (BC) material layer.

Example embodiment 14: The integrated circuit structure of example embodiment 8, 9, 10, 11 or 12, wherein the strain inducing layer includes a silicon oxynitride (SiON) material layer.

Example embodiment 15: The integrated circuit structure of example embodiment 8, 9, 10, 11, 13 or 14, wherein the channel material layer includes a polycrystalline silicon material layer.

Example embodiment 16: The integrated circuit structure of example embodiment 8, 9, 10, 11, 13 or 14, wherein the channel material layer includes a polycrystalline Group III-V material layer.

Example embodiment 17: The integrated circuit structure of example embodiment 8, 9, 10, 11, 13 or 14, wherein the channel material layer includes a semiconducting oxide material layer.

Example embodiment 18: An integrated circuit structure includes an insulator structure above a substrate, the insulator structure having a trench therein, the trench having sidewalls and a bottom. A strain inducing layer is in the trench in the insulator structure, the strain inducing layer conformal with the sidewalls and bottom of the trench. A channel material layer is on the strain inducing layer in the trench a gate dielectric layer on the channel material layer in the trench. A gate electrode is on the gate dielectric layer in the trench, the gate electrode having a first side opposite a second side and having an exposed top surface. A first conductive contact is laterally adjacent the first side of the gate electrode. A second conductive contact is laterally adjacent the second side of the gate electrode.

Example embodiment 19: The integrated circuit structure of example embodiment 18, further including a third conductive contact over and in contact with the exposed top surface of the gate electrode.

Example embodiment 20: The integrated circuit structure of example embodiment 18 or 19, wherein the strain inducing layer includes a boron carbide (BC) material layer.

Example embodiment 21: The integrated circuit structure of example embodiment 18 or 19, wherein the strain inducing layer includes a silicon oxynitride (SiON) material layer.

Example embodiment 22: The integrated circuit structure of example embodiment 18, 19, 20 or 21, wherein the channel material layer includes a polycrystalline silicon material layer.

Example embodiment 23: The integrated circuit structure of example embodiment 18, 19, 20 or 21, wherein the channel material layer includes a polycrystalline Group III-V material layer.

Example embodiment 24: The integrated circuit structure of example embodiment 18, 19, 20 or 21, wherein the channel material layer includes a semiconducting oxide material layer.

What is claimed is:

1. An integrated circuit structure, comprising:
   a strain inducing layer on an insulator layer above a substrate;
   a polycrystalline channel material layer on the strain inducing layer, wherein the polycrystalline channel material layer is a non-planar and strained polycrystalline channel material layer;
   a gate dielectric layer on a first portion of the polycrystalline channel material layer; and
   a gate electrode on the gate dielectric layer, the gate electrode having a first side opposite a second side;
   a first conductive contact adjacent the first side of the gate electrode, the first conductive contact on a second portion of the polycrystalline channel material layer; and
   a second conductive contact adjacent the second side of the gate electrode, the second conductive contact on a third portion of the polycrystalline channel material layer.

2. The integrated circuit structure of claim 1, wherein the strain inducing layer comprises a boron carbide (BC) material layer.

3. The integrated circuit structure of claim 1, wherein the strain inducing layer comprises a silicon oxynitride (SiON) material layer.

4. The integrated circuit structure of claim 1, wherein the polycrystalline channel material layer comprises a polycrystalline silicon material layer.

5. The integrated circuit structure of claim 1, wherein the polycrystalline channel material layer comprises a polycrystalline Group III-V material layer.

6. The integrated circuit structure of claim 1, wherein the polycrystalline channel material layer comprises a semiconducting oxide material layer.

7. The integrated circuit structure of claim 1, wherein the gate dielectric layer comprises a layer of a high-k dielectric material.

8. An integrated circuit structure, comprising:
   an insulator structure above a substrate, the insulator structure having a topography that varies along a plane parallel with a global plane of the substrate;
   a strain inducing layer on the insulator structure, the strain inducing layer conformal with the topography of the insulator structure;
   a channel material layer on the strain inducing layer, the channel material layer conformal with the topography of the insulator structure;

a gate electrode over a first portion of the channel material layer, the gate electrode having a first side opposite a second side; a first conductive contact adjacent the first side of the gate electrode, the first conductive contact on a second portion of the channel material layer; and a second conductive contact adjacent the second side of the gate electrode, the second conductive contact on a third portion of the channel material layer.

9. The integrated circuit structure of claim 8, wherein the insulator structure comprises one or more fins, individual ones of the fins having a top and sidewalls, the strain inducing layer on the top and sidewalls of the individual ones of the fins.

10. The integrated circuit structure of claim 8, further comprising:
a gate dielectric layer between the gate electrode and the first portion of the channel material layer.

11. The integrated circuit structure of claim 10, wherein the gate dielectric layer comprises a layer of a high-k dielectric material.

12. The integrated circuit structure of claim 8, further comprising:
a first dielectric spacer between the first conductive contact and the first side of the gate electrode; and
a second dielectric spacer between the second conductive contact and the second side of the gate electrode.

13. The integrated circuit structure of claim 8, wherein the strain inducing layer comprises a boron carbide (BC) material layer.

14. The integrated circuit structure of claim 8, wherein the strain inducing layer comprises a silicon oxynitride (SiON) material layer.

15. The integrated circuit structure of claim 8, wherein the channel material layer comprises a polycrystalline silicon material layer.

16. The integrated circuit structure of claim 8, wherein the channel material layer comprises a polycrystalline Group III-V material layer.

17. The integrated circuit structure of claim 8, wherein the channel material layer comprises a semiconducting oxide material layer.

18. An integrated circuit structure, comprising:
an insulator structure above a substrate, the insulator structure having a trench therein, the trench having sidewalls and a bottom; a strain inducing layer in the trench in the insulator structure, the strain inducing layer conformal with the sidewalls and bottom of the trench;
a channel material layer on the strain inducing layer in the trench;
a gate dielectric layer on the channel material layer in the trench;
a gate electrode on the gate dielectric layer in the trench, the gate electrode having a first side opposite a second side and having an exposed top surface;
a first conductive contact laterally adjacent the first side of the gate electrode; and
a second conductive contact laterally adjacent the second side of the gate electrode.

19. The integrated circuit structure of claim 18, further comprising: a third conductive contact over and in contact with the exposed top surface of the gate electrode.

20. The integrated circuit structure of claim 18, wherein the strain inducing layer comprises a boron carbide (BC) material layer.

21. The integrated circuit structure of claim 18, wherein the strain inducing layer comprises a silicon oxynitride (SiON) material layer.

22. The integrated circuit structure of claim 18, wherein the channel material layer comprises a polycrystalline silicon material layer.

23. The integrated circuit structure of claim 18, wherein the channel material layer comprises a polycrystalline Group III-V material layer.

24. The integrated circuit structure of claim 18, wherein the channel material layer comprises a semiconducting oxide material layer.

\* \* \* \* \*